(12) United States Patent
Waldfried et al.

(10) Patent No.: US 6,630,406 B2
(45) Date of Patent: Oct. 7, 2003

(54) PLASMA ASHING PROCESS

(75) Inventors: Carlo Waldfried, Falls Church, VA (US); Ivan Berry, Ellicott City, MD (US); Orlando Escorcia, Falls Church, VA (US); Qingyuan Han, Columbia, MD (US); Palani Sakthivel, Gaithersburg, MD (US)

(73) Assignee: Axcelis Technologies, Beverly, MA (US)

( * ) Notice: Subject to any disclaimer, the term of this patent is extended or adjusted under 35 U.S.C. 154(b) by 109 days.

(21) Appl. No.: 09/855,177

(22) Filed: May 14, 2001

(65) Prior Publication Data

US 2003/0032300 A1 Feb. 13, 2003

(51) Int. Cl.$^7$ .................. H01L 21/302; H01L 21/461
(52) U.S. Cl. .................. 438/710; 438/711; 438/714; 438/725
(58) Field of Search .................. 438/706, 710, 438/712, 725, 714, 715, 711

(56) References Cited

U.S. PATENT DOCUMENTS

| | | | | |
|---|---|---|---|---|
| 5,352,636 A | * | 10/1994 | Beinglass | 438/475 |
| 5,545,289 A | | 8/1996 | Chen et al. | 156/643.1 |
| 5,660,682 A | * | 8/1997 | Zhao et al. | 438/715 |
| 5,965,934 A | | 10/1999 | Cheung et al. | 257/642 |
| 6,037,255 A | | 3/2000 | Hussein et al. | 438/675 |
| 6,107,192 A | | 8/2000 | Subrahmanyan et al. | 438/637 |
| 6,114,259 A | * | 9/2000 | Sukharev et al. | 438/789 |
| 6,207,583 B1 | | 3/2001 | Dunne et al. | 438/725 |
| 6,313,042 B1 | | 11/2001 | Cohen et al. | 438/734 |
| 6,319,842 B1 | | 11/2001 | Khosla et al. | 438/714 |
| 6,346,489 B1 | | 2/2002 | Cohen et al. | |
| 6,355,571 B1 | | 3/2002 | Huang et al. | 438/706 |

FOREIGN PATENT DOCUMENTS

EP    1081751 A2  *  7/2001

* cited by examiner

*Primary Examiner*—Amir Zarabian
*Assistant Examiner*—Khanh Duong
(74) *Attorney, Agent, or Firm*—Cantor Colburn LLP

(57) ABSTRACT

An oxygen-free and nitrogen-free plasma ashing process for removing photoresist in the presence of a low k material from a semiconductor substrate. The process includes forming reactive species by exposing a plasma gas composition to an energy source to form plasma. The plasma gas composition is free from oxygen-bearing and nitrogen-bearing gases. The plasma selectively removes the photoresist from the underlying substrate containing low k material by exposing the photoresist to the reactive species. The process can be used with carbon and/or hydrogen based low k dielectric materials.

45 Claims, 3 Drawing Sheets

PLASMA ASHING PROCESS

FIELD OF INVENTION

The present invention relates generally to plasma ashing processes for selectively removing photoresist, polymers and residues from a substrate surface. More particularly, the process relates to an oxygen-free and nitrogen-free plasma ashing process.

BACKGROUND OF THE INVENTION

Ashing is a plasma mediated stripping process by which photoresist, polymer and/or residues are stripped or removed from a substrate upon exposure to the plasma. Ashing generally occurs after an etching process has been performed in which the photoresist material is used as a photomask for etching a pattern into the substrate. Additionally, the ashing process may be performed for removal of misaligned resist patterns ("rework wafers") and in lift-off processes. The process steps occurring prior to ashing may modify the surface of the photoresist, form polymers and/or form residues. It is highly desirable when ashing that complete removal of the photoresist, polymer and/or residues occur as quickly as possible without loss of any of the materials comprising the underlayers.

It is important to note that ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The plasma generally includes high energy ion bombardment at low temperatures to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. The ashing plasma chemistry is much less aggressive than etching chemistries and generally is chosen to remove the photoresist mask layer at a rate much greater than the removal rate of the underlying substrate. Moreover, most ashing processes heat the substrate to temperatures greater than 200° C. to increase the plasma reactivity. Thus, etching and ashing processes are directed to removal of significantly different materials and as such, require completely different plasma chemistries and processes. Successful ashing processes are not used to permanently transfer an image into the substrate. Rather, successful ashing processes are defined by the photoresist, polymer and residue removal rates without affecting or removing layers comprising the underlying substrate.

Ashing selectivity is defined as the relative removal rate of the photoresist compared to the underlying layer. It is preferred to have an ashing selectivity of at least 50:1, wherein the photoresist is removed at least 50 times faster than the underlying substrate. More preferably, the ashing selectivity is much greater than 100:1.

During plasma ashing processes, it is important to maintain a critical dimension (CD) for the various features within a tightly controlled specification as well as promote proper underlayer surface conditions for successful metal filling in the process steps occurring after photoresist, polymer, and residue removal. Small deviations in the patterned profiles formed in the underlayers can adversely impact device performance, yield and reliability of the final integrated circuit. Traditionally, the ashing plasma has been generated from oxygen-containing gases. However, it has been found that oxygen-containing plasmas readily damage certain materials used in advanced integrated circuit manufacture. For example, oxygen-containing plasmas are known to raise the dielectric constant of low k dielectric underlayers during plasma processing. The increases in dielectric constant affects, among others, interconnect capacitance, which directly impacts device performance. Moreover, the use of oxygen-containing plasmas is generally less preferred for advanced device fabrication employing copper metal layers.

In order to overcome these problems, oxygen-free plasma chemistries have been developed. Oxygen-free plasmas can be used to effectively remove photoresist, polymers and residues from substrates containing low k dielectric materials without physically damaging the low k dielectric layer. Oxygen-free plasmas are typically generated from a hydrogen and nitrogen gas mixture that may further contain fluorine gases. However, in some cases it has been found that the use of oxygen-free plasmas containing nitrogen may alter and/or affect the chemical, mechanical and electrical properties of underlying substrate. For example, exposing carbon and/or hydrogen containing low k dielectric materials to oxygen-free plasma generated from hydrogen, nitrogen and fluorine gas mixtures results in significant damage. Occasionally, the damage is not detected during metrology inspection of the substrate after plasma processing. However, the damage can be readily demonstrated by a subsequent wet cleaning process, as may be typically employed after plasma ashing, wherein portions of the carbon and/or hydrogen-containing low k dielectric material are removed. The removed portions of the dielectric material are a source of variation in the critical dimension (CD) of the feature that is frequently unacceptable and impacts overall device yield. Moreover, even if a wet clean process is not included, the electrical and mechanical properties of the dielectric material may be changed by exposure to the oxygen-free plasmas thereby affecting operating performance. It is believed that carbon is depleted from the dielectric material during the plasma exposure. Since oxygen-free plasmas are normally generated from gas mixtures that contain nitrogen, it is believed that uptake of nitrogen occurs into the dielectric that causes problems during subsequent metal filling processes, such as the creation of voids at the bottom of trench structures.

Accordingly, it is highly desirable to have an ashing plasma chemistry that completely and rapidly removes the photoresist, polymer and residues without affecting or removing the underlying surface materials.

SUMMARY OF THE INVENTION

A plasma ashing process for selectively removing photoresist, polymers and residues from a surface of a semiconductor substrate. The photoresist, polymers and residues are removed from the substrate by exposure to a plasma that is both oxygen-free and nitrogen-free. The process includes forming reactive species by exposing a plasma gas composition to an energy source to form plasma. The plasma generated from the gas composition is free from reactive nitrogen species and reactive oxygen species. A substrate is exposed to the plasma to selectively remove the photoresist, polymers and residues from the substrate and leave the substrate substantially the same as before exposing the substrate to the plasma. The plasma ashing process may occur subsequent to an etching process, subsequent to an implantation process or during a rework or lift-off process. High ashing selectivity greater than 50:1 is achieved using the process.

The gas composition for generating the plasma consists essentially of hydrogen-bearing gas and a noble gas. Preferably, the noble gas is helium. The hydrogen-bearing gas is selected from the group consisting of hydrocarbons, hydrofluorocarbons, and hydrogen gas. The hydrogen bearing gas is in an amount ranging from about 1 percent to about 99. percent by volume of the total plasma gas composition. The gas composition may further include a fluorine-bearing gas, wherein the fluorine bearing gas is selected from the group consisting of a compound having a formula $C_xH_yF_z$, wherein x ranges from 1 to 4, y ranges from 0 to 9 and z ranges from 1 to 10, HF, $F_2$ and $SF_6$.

In a preferred embodiment, the ashing process includes generating plasma from a gas composition consisting essentially of hydrogen gas, helium gas and tetrafluoromethane gas.

Preferably, the process is used with substrates including a carbon and/or hydrogen-containing insulating layer having a dielectric constant less than 3.0. It has been found that the dielectric constant of the carbon and/or hydrogen-containing insulating layer does not change substantially during the plasma ashing process nor does its chemical composition change. Advantageously, the process may further include a rinsing step, wherein a critical dimension of a feature in the substrate does not change substantially during rinsing. The rinsing step may include wet cleaning the substrate with an aqueous HF solution.

These and other objects, advantages and features of the invention will become better understood from the detailed description of the invention that is described in conjunction with the accompanying drawings.

DETAILED DESCRIPTION OF THE INVENTION

Figure 1A:
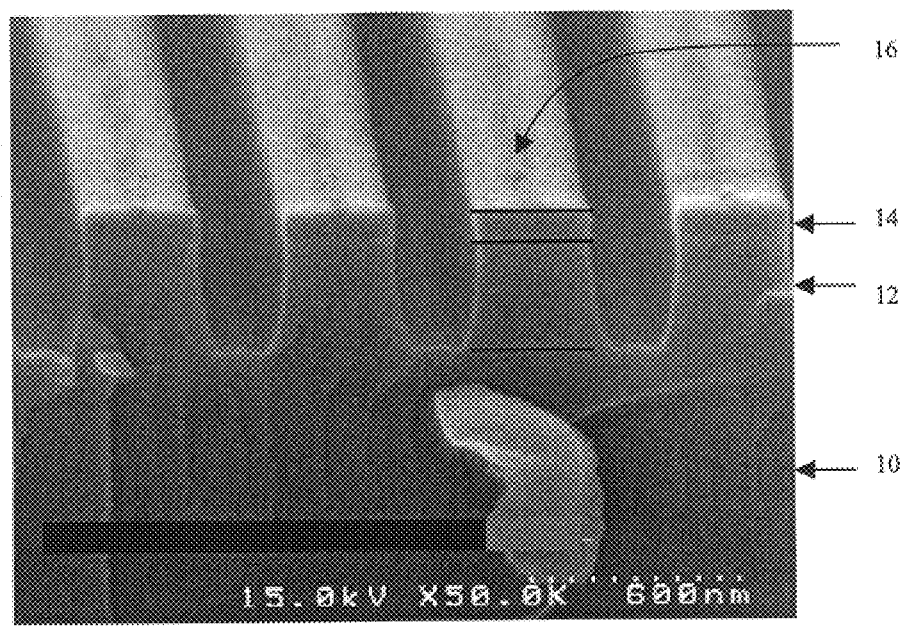
FIG. 1A is a scanning electron microscopy micrograph of trench features after a conventional post etch ashing process using a helium/hydrogen gas mixture (He/$H_2$) as one of the plasma gas components for generating the plasma.

A process for selectively removing photoresist, polymers and residues from a substrate. Generally, the process includes ashing the substrate with plasma that is both oxygen-free and nitrogen-free for selectively removing the photoresist, polymers and residues from the substrate. The ashing process is especially suitable for use in removing photoresist, polymers and residues from substrates that include low k dielectric materials therein. Preferably, the process is used with substrates, wherein the low k materials contain carbon and/or hydrogen within its structure such as doped oxides, porous materials and organic low k films. The carbon-containing low k dielectric materials may include pendant groups that contain carbon or may be carbon based wherein the backbone of the dielectric material is primarily comprised of an interconnecting network of carbon. The process employing the nitrogen-free and oxygen-free plasma provides high ashing selectivity and overcomes the problems noted in the prior art that occur from ashing photoresist, polymers and residues from carbon and/or hydrogen based low k dielectric materials. Moreover, the process alleviates the subsequent metal filling problems caused by nitrogen in the ashing plasma.

The ashing process includes generating reactive species from a plasma gas mixture and exposing a substrate to the reactive species. The particular components of the plasma gas mixture are selected by their ability to form a gas and plasma at plasma forming conditions. The gas mixture selected is free from components that generate reactive oxygen species and reactive nitrogen species at plasma forming conditions. More preferably, the gas mixture is free from oxygen-containing compounds and nitrogen-containing compounds. The gas mixture may include reactive gases such as a fluorine-bearing gas, a hydrogen-bearing gas, and mixtures thereof. The gas mixture may further comprise an inert gas such as argon, helium, neon and the like. The plasma generated from the gas mixture primarily reacts with carbon and other atoms in the photoresist, polymers, and residues to form volatile compounds and/or rinse removable compounds. The process is optimized to have a selectivity greater than 50:1.

Hydrogen-bearing gases suitable for use in the process include those compounds that contain hydrogen. The hydrogen-bearing gases include hydrocarbons, hydrofluorocarbons, hydrogen gas or mixtures thereof. Preferred hydrogen-bearing gases exist in a gaseous state at plasma forming conditions and release hydrogen to form reactive hydrogen such as atomic hydrogen species under plasma forming conditions. The hydrocarbons or hydrofluorcarbons are generally unsubstituted or may be partially substituted with a halogen such as bromine, chlorine or fluorine. Examples of hydrogen-bearing hydrocarbon gases include methane, ethane and propane.

Preferred hydrogen-bearing gases are mixtures of a hydrogen gas and a noble gas. Examples of noble gases suitable for use in the process include a gas in Group VIII of the periodic table such as argon, neon, helium and the like. Although prior art oxygen-free plasmas generally use a forming gas composition that includes a hydrogen and nitrogen gas mixture, the use of nitrogen gas in the process is expressly excluded. Consequently, since forming gas is hereinafter defined as a gas containing a mixture of hydrogen and nitrogen gases, the use of forming gas in the process is expressly excluded. Particularly preferable for use in the present invention is a gas mixture that includes hydrogen and helium gases. Helium gas generates helium atoms in the plasma that are light and readily diffuse to the substrate, which results in excellent carrier characteristics for plasma generated reactive hydrogen species.

For safety reasons, the percentage of hydrogen gas in the gas mixture generally does not exceed about 5 percent by volume of the gas mixture. However, higher amounts of hydrogen are acceptable and sometimes preferred for increasing the photoresist removal rate and selectivity. Preferably, the amount of hydrogen in the gas mixture is from about 1 to about 99 percent of the total volume. More preferably, the amount of hydrogen in the gas mixture is from about 10 to about 30 percent of the total volume.

Fluorine-bearing compounds in the plasma are less than about 10 percent of the total volume of the plasma gas mixture to maximize selectivity. It has been found that when the fluorine compounds are greater than about 10 percent by volume, polymerization of the photoresist byproducts can occur making the polymerized photoresist more difficult to remove. Preferred fluorine compounds include those compounds that generate fluorine reactive species when excited by the plasma. Preferably, the fluorine compound is a gas at plasma forming conditions and is selected from the group consisting of a compound having the general formula $C_xH_yF_z$, wherein x ranges from 1 to 4, y ranges from 0 to 9 and z ranges from 1 to 10, HF, $F_2$ and $SF_6$. Other fluorine bearing compounds that do not generate reactive nitrogen or oxygen species will be apparent to those skilled in the art. More preferably, the fluorine-bearing compound is $CF_4$, $C_2F_6$ or mixtures thereof.

Photoresists are generally organic photosensitive films used for transfer of images to an underlying substrate. The present invention is generally applicable to ashing those photoresists used in g-line, i-line, DUV, 193 nm, and 157 nm applications or the like. This includes, but is not limited to, novolaks, polyvinylphenols, acrylates, acetals, polyimides, ketals, cyclic olefins or the like. Other photoresist formulations suitable for use in the present invention will be apparent to those skilled in the art in view of this disclosure. The photoresist may be positive acting or negative acting depending on the photoresist chemistries and developers chosen.

The insulating layers used in advanced integrated circuits typically include the use of low k materials that have dielectric constants less than about 3.0. The low k dielectric materials can be spun onto the substrate as a solution or deposited by a chemical vapor deposition process. Important low k film properties include thickness and uniformity, dielectric constant, refractive index, adhesion, chemical resistance, thermal stability, pore size and distribution, coefficient of thermal expansion, glass transition temperature, film stress and copper diffusion coefficient. Low k dielectrics can be generally classified as one of three types: organic, porous and doped oxides. Organic low k dielectric materials include polyimides, benzocyclobutene, parylenes and fluorocarbons. An example of commercially available organic dielectrics are spin-on aromatic hydrocarbons referred to by the trademark SILK® and commercially available from Dow Chemical. SILK® contains no fluorine or silicon and has a reported dielectric constant of 2.6 to 2.8. Examples of porous low k dielectric materials include nanoglass and aerogels. Examples of doped oxide low k dielectric materials include hydrogen-doped oxides, e.g., hydrogen silsesquioxanes (HSQ), fluorine-doped oxides, e.g., fluorinated silicate glass (FSG) and carbon-doped oxides such as those available under the trademark CORAL®. A spin-on HSQ is commercially available from Dow Corning under the trademark FOx®. FOx® is reported to have a dielectric constant of 2.6 to 3.0. Hybrid carbon containing dielectrics are commercially available under the trademark HOSP®. Other examples include xerogels and methyl silsesquioxanes (MSQ). Other low k dielectric materials will be apparent to those skilled in the art in view of this disclosure.

The process can be practiced in conventional plasma ashers. The invention is not intended to be limited to any particular plasma asher. For example, a plasma asher employing an inductively coupled plasma reactor could be used or a downstream plasma asher could be used. Preferably, the plasma asher is a downstream plasma asher, such as for example, microwave plasma ashers commercially available under the trade name Fusion GEMINI ES® from the Axcelis Technologies, Inc. in Rockville, Md. More preferably, the plasma asher is adapted to selectively expose the substrate to reactive atomic species.

The settings and optimization for particular plasma ashers will be well within the skill of those in the art in view of this disclosure. Plasma ashers generally are comprised of a plasma generating chamber and a plasma reaction chamber. For exemplary purposes only, in a 300 mm Fusion ES3 downstream plasma asher, the wafers are preferably heated in the reaction chamber to a temperature between room temperature and 450° C. The temperatures used during processing may be constant or alternatively, ramped or stepped during processing. Increasing the temperature is recognized by those skilled in the art as a method to increase the ashing rate. More preferably, the wafers are heated to temperatures ranging from 350° C. to 450° C. The pressure within the reaction chamber is preferably reduced to about 1 torr or more. More preferably, the pressure is operated in a range from about 1 torr to about 4 torr. An excitable gas mixture is fed into the plasma-generating chamber via a gas inlet. The gas mixture is exposed to an energy source within the plasma-generating chamber, e.g., microwave energy, preferably between about 1000W and 4000W, to generate excited or energetic atoms from the gas mixture. The generated plasma is comprised of electrically neutral and charged particles formed from the gases used in the plasma gas mixture. The charged particles are selectively removed prior to plasma reaching the wafer. Preferably, the gas mixture for forming the plasma includes a hydrogen and helium gas mixture. More preferably, the gas mixture includes a mixture of hydrogen, helium, and fluorine gases. The total gas flow rate is preferably from about 500 to 12000 standard cubic centimeters per minute (sccm) for the 300 mm downstream plasma asher. The photoresist, polymers and residues are selectively removed from the wafer by reaction with the excited or energetic atoms generated by the plasma. The reaction may be optically monitored for endpoint detection as is recognized by those in the art.

While not wanting to be bound by theory, it is believed that prior art processes cause carbon depletion in the carbon-containing low k dielectric by generating reactive nitrogen or oxygen species in the plasma. The reactive oxygen and nitrogen species react with the carbon dopants of the dielectric to form volatile gases such as CO, $CO_2$, HCN and CN. Accordingly, the gas mixtures for forming the plasma do not contain any gases that generate reactive nitrogen or oxygen species.

After exposure to the oxygen-free and nitrogen-free plasma, the wafers may be exposed to a peroxide rinse or a deionized water rinse or a wet stripper to remove any photoresist, polymer and residues remaining on the wafer. Wet strippers include acids, bases and solvents as is known to those skilled in the art. The particular wet strippers used are well within the skill of those in the art. For example, nitric acid, sulfuric acid, ammonia, hydrofluoric acid are commonly employed as wet strippers. In operation, the wet stripper is immersed, puddled, streamed, sprayed or the like onto the substrate and subsequently rinsed with deionized water. It has been found that the use of wet strippers is a fairly easy and inexpensive test to determine if the ashing plasma affects the chemical, electrical or mechanical properties of the underlying substrate.

The following examples are presented for illustrative purposes only, and are not intended to limit the scope of the invention.

EXAMPLE 1

As illustrated by this example, a significant advantage of the oxygen-free and nitrogen-free plasma process is the improvement in removal efficiency of photoresist, polymers and residues from substrates containing carbon based low k dielectrics without affecting the underlying dielectric layers. This is a significant commercial advantage as device manufacturers transition to the use of low k dielectric layers in the fabrication of advanced integrated circuits.

Figure 1B:
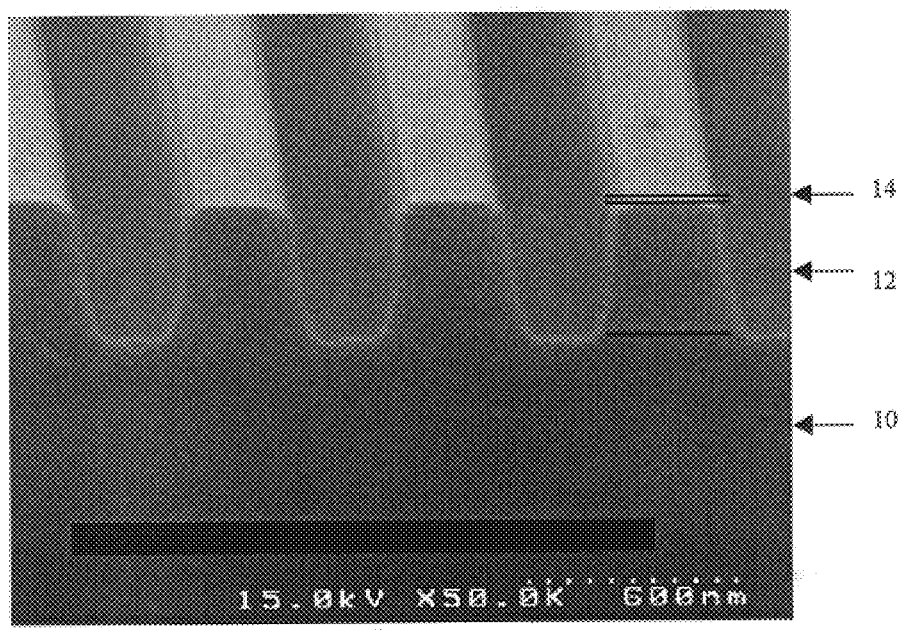
FIG. 1B is a scanning electron microscopy micrograph of trench features after a wet cleaning process of the substrate ashed in accordance with FIG. 1A.

Referring now to FIGS. 1A and 1B, trench patterns were etched into multiple silicon substrates 10 by an etcher using standard etching processes. The substrates 10 included a low k dielectric layer 12 and a silicon dioxide layer 14. The patterns were selectively etched by use of a patterned I-line photoresist mask. The low k dielectric layer 12 was a carbon-doped oxide commercially available under the trade name CORAL. The substrates were then ashed using a Fusion Gemini ES3 Plasma Asher available from Axcelis Technologies, Incorporated. Processing conditions are set forth in table I. The plasma gas mixture contained hydrogen, helium and $CF_4$ gases. The hydrogen gas was mixed with helium prior to generating the plasma, wherein the percentage of hydrogen gas was 5 percent by volume of the total hydrogen/helium mixture. The ashing process removed substantially all of the photoresist, polymers and post etch residues remaining on the substrate after etching. Some residue 16 remained on the substrates.

TABLE I

| | | Oxygen-free and Nitrogen-free Plasma | | | |
|---|---|---|---|---|---|
| Step | Time (min.) | Pressure (torr) | Power (W) | Temp (° C.) | 5% $H_2$/He (sccm) | $CF_4$ (sccm) |
| 1 | 25 | 1.5 | Off | 370 | 5000 | 50 |
| 2 | 20 | 1.5 | 1500 | 370 | 5000 | 50 |

After ashing was complete, the substrates were subjected to a wet clean process. The substrates were dipped into a hydrofluoric (HF) acid bath for 2 minutes. The hydrofluoric acid bath was prepared from a 50% concentrate and diluted with deionized water at a 100:1 ratio. The substrates, after ashing and after wet stripping, were examined by cross-sectional analysis using scanning electron microscopy at a magnification of about 50,000x. FIG. 1A shows a representative cross-section of a substrate after the ashing process. FIG. 1B shows a representative cross-section of a substrate after the HF wet clean process. A comparison of the substrates after each process did not show any substantial changes to critical dimensions or feature profiles. The post etch residue 16 was effectively removed by the wet cleaning process.

EXAMPLE 2

In this example, the substrates were prepared in accordance with Example and exposed to a conventional ashing plasma process. The plasma gas mixture included nitrogen gas in place of the helium gas and at the same volume percentage. All other conditions were identical to that in Example 1. The process conditions are shown in Table II.

TABLE II

| | | Nitrogen-containing Plasma | | | |
|---|---|---|---|---|---|
| Step | Time (min.) | Pressure (torr) | Power (W) | Temp (° C.) | 5% $H_2/N_2$ (sccm) | $CF_4$ (sccm) |
| 1 | 25 | 1.5 | Off | 370 | 5000 | 50 |
| 2 | 20 | 1.5 | 1500 | 370 | 5000 | 50 |

Figure 2A:
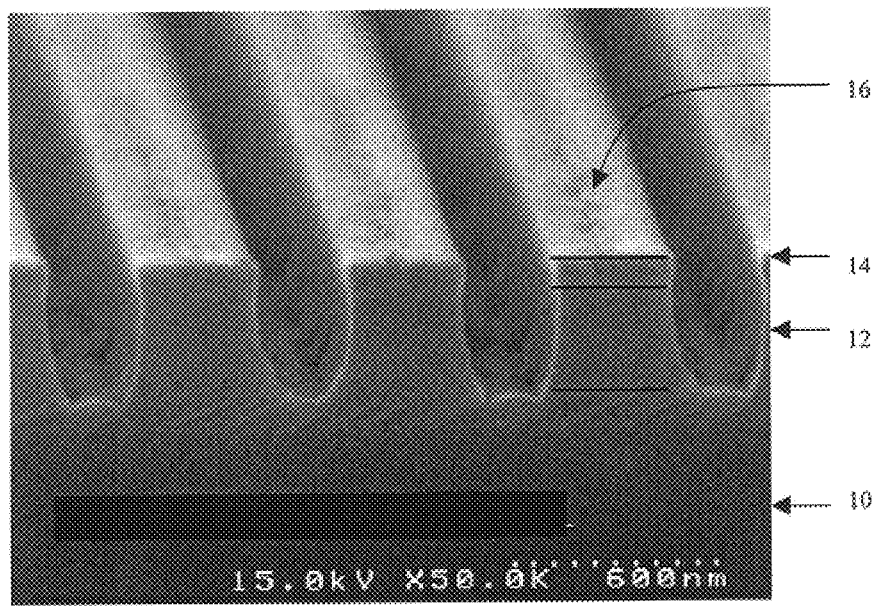
FIG. 2A is a scanning electron microscopy micrograph of trench features after a conventional post etch ashing process using nitrogen-based forming gas ($N_2$/$H_2$) as one of the plasma gas components for generating the plasma.
Figure 2B:
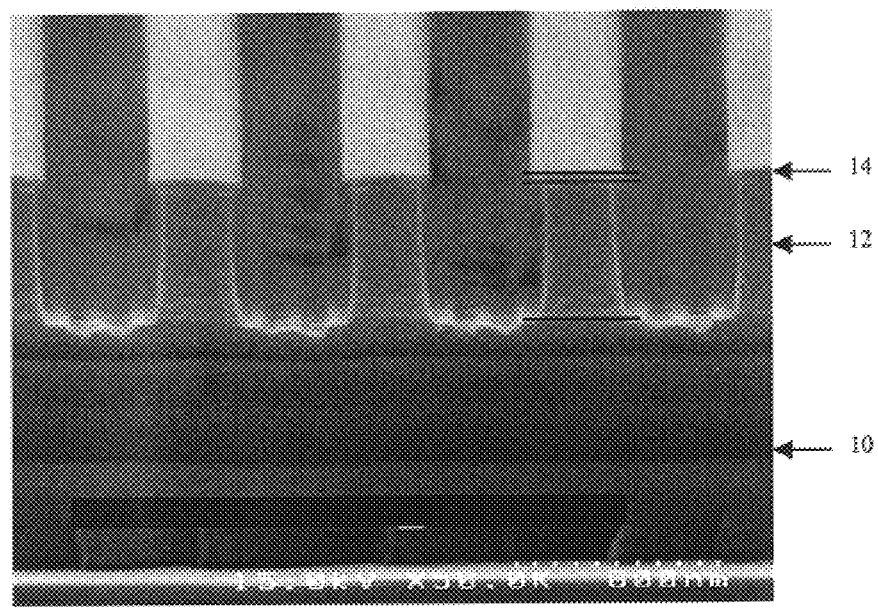
FIG. 2B is a scanning electron microscopy micrograph of trench features after a wet cleaning process of the substrate ashed in accordance with FIG. 2A.

As shown in FIG. 2A, scanning electron microscopy of substrates ashed with the nitrogen-containing plasma yielded results similar to the nitrogen-free plasma process of Example 1. A comparison of FIGS. 1A and 2A show similar etch profiles. However, as shown in FIG. 2B, exposing the ashed wafers to the same wet clean process used in Example 1 resulted in significant CD loss of the low k dielectric layer 12. The wet clean process clearly removed significant amounts of the low k dielectric material resulting in extensive undercutting. These results confirm that nitrogen present in the plasma chemically modifies the low k dielectric layer 12 since the only variable changed between the processes used Examples 1 and 2 was the choice of the inert gas: nitrogen or helium. Moreover, analysis of the substrates exposed to the nitrogen-containing plasma did not show any visible physical damage between the different plasmas until the substrates were exposed to the wet clean process. Moreover, since the nitrogen-containing ashing process chemically modified the low k dielectric underlayer, it is reasonable to assume that the mechanical and electrical properties have changed as well. In contrast, exposing the substrates to a plasma that is both oxygen-free and nitrogen free did not demonstrate this behavior.

EXAMPLE 3

Figure 3:
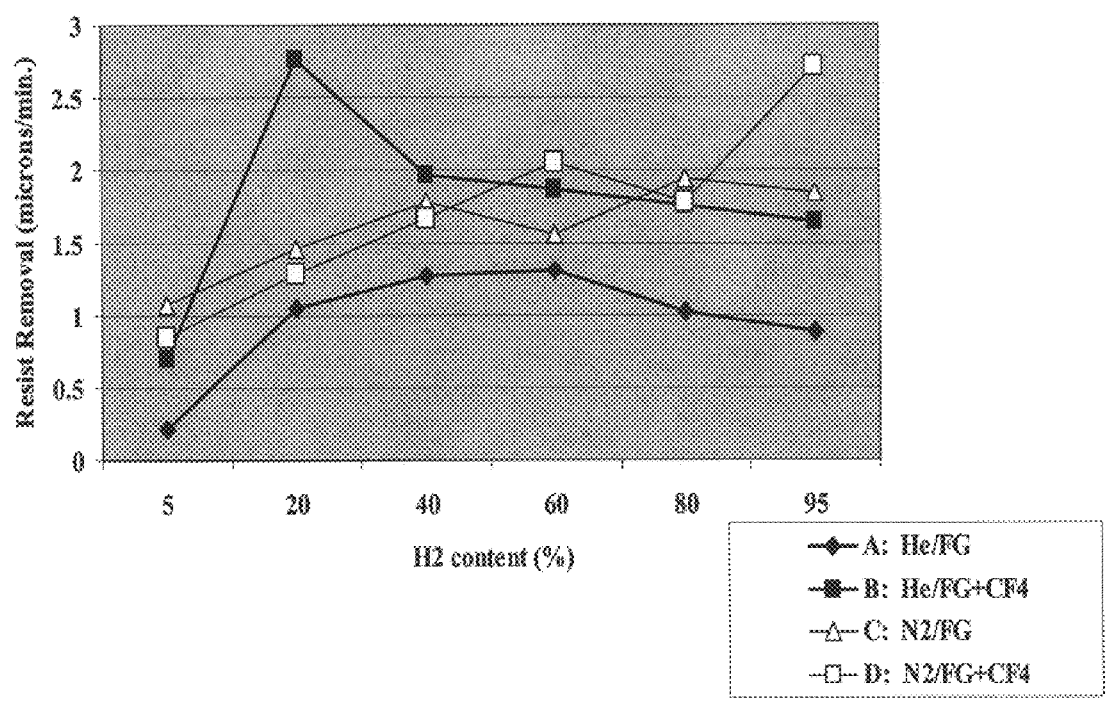
FIG. 3 is a graph depicting photoresist removal rates for various plasma gas mixtures including helium gas or nitrogen gas as a function of percent hydrogen gas in the mixture used to form the plasma.

In this example, the rate of photoresist removal was monitored as a function of the percentage of hydrogen gas in the plasma. Substrates were coated with a thick layer of photoresist and exposed to one of four different plasmas (A–D) in a Fusion Gemini ES3 plasma asher. The process conditions and flow rates were held constant for each wafer set. The photoresist thickness was conventionally measured by ellipsometry before and after processing in order to determine the removal rate. As shown in Table III, the substrates were exposed to: A. a nitrogen-free plasma, B. a nitrogen-free plasma with tetrafluoromethane ($CF_4$), C. a nitrogen-containing plasma and D. a nitrogen-containing plasma with $CF_4$. The percentage of hydrogen in the plasma gas mixture was varied as a percentage of the total volume of the hydrogen gas mixture. The results are graphically shown in FIG. 3.

TABLE III

| | Plasma Gas Compositions | | |
|---|---|---|---|
| PLASMA | Hydrogen/Nitrogen (FORMING GAS) flow rate (sccm) | Hydrogen/Helium flow rate (sccm) | $CF_4$ flow rate (sccm) |
| A | OFF | 7000 | OFF |
| B | OFF | 6990 | 10 |
| C | 7000 | OFF | OFF |
| D | 6990 | OFF | 10 |

The nitrogen-free plasmas A and B showed effective photoresist removal that was comparable to removal rates obtained with the nitrogen-containing plasmas C and D. All of the plasmas demonstrated an increase in photoresist removal rate as the hydrogen content was increased from about 5 to about 40%. At amounts greater than 40%, the increase in hydrogen content demonstrated little effect on the photoresist removal rates and the removal rate was relatively constant. It is interesting to note that the use of fluorine showed little or no difference in reactivity for the nitrogen containing plasma D whereas the use of fluorine in the nitrogen-free plasma B gave the highest removal rates. At about 20 percent hydrogen content, the removal rate for plasma B was about double the removal rate for any of the other plasmas A, C and D. Plasmas that provide the highest possible removal rate are especially advantageous for improved throughputs in production. Moreover, it is preferred to use the least amount of hydrogen in the plasma for safety considerations. Thus, having a high removal rate coupled with a low percentage of hydrogen provides a significant commercial advantage in production.

The foregoing descriptions of the preferred embodiments of the invention have been presented for purposes of illustration and description. It is not intended to be exhaustive or to limit the invention to the precise forms disclosed. Obvious modifications or variations are possible in light of the above teachings. The embodiments were chosen and described to provide the best illustration of the principles of the invention and its practical applications to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A plasma ashing process for selectively removing photoresist from a semiconductor substrate including a low k material, the process comprising:
   forming reactive species by exposing a plasma gas composition to an energy source to form a plasma, wherein the plasma is free from reactive nitrogen species and reactive oxygen species;
   exposing the substrate having the photoresist thereon to the reactive species to selectively remove the photoresist and leave the low k material substantially the same as before exposing the substrate to the reactive species.

2. The plasma ashing process according to claim 1, wherein the process occurs subsequent to an etching process.

3. The plasma ashing process according to claim 1, wherein the process occurs during a rework process.

4. The plasma ashing process according to claim 1, wherein the gas composition consists essentially of hydrogen-bearing gas and a noble gas.

5. The plasma ashing process according to claim 4, wherein the noble gas is helium.

6. The plasma ashing process according to claim 4, wherein the hydrogen-bearing gas is selected from the group consisting of hydrocarbons, hydrofluorocarbons, and hydrogen gas.

7. The plasma ashing process according to claim 4, wherein the gas composition further comprises a fluorine-bearing gas.

8. The plasma ashing process according to claim 7, wherein the fluorine bearing gas is selected from the group consisting of a compound having a formula $C_xH_yF_z$, wherein x ranges from 1 to 4, y ranges from 0 to 9 and z ranges from 1 to 10, HF, $F_2$ and $SF_6$.

9. The plasma ashing process according to claim 1, wherein the substrate comprises a carbon and/or hydrogen containing insulating layer having a dielectric constant less than 3.0.

10. The plasma ashing process according to claim 4, wherein the hydrogen bearing gas is hydrogen gas.

11. The plasma ashing process according to claim 4, wherein the hydrogen bearing gas is in an amount ranging from about 3 percent to about 30 percent by volume of the total plasma gas composition.

12. The plasma ashing process according to claim 9, wherein the dielectric constant of the carbon and/or hydrogen containing insulating layer essentially does not change during the plasma ashing process.

13. The plasma ashing process according to claim 1, wherein the chemical composition of the substrate essentially does not change during the plasma ashing process.

14. The plasma ashing process according to claim 1, further comprising rinsing the substrate, wherein a critical dimension of a feature in the substrate essentially does not change during rinsing.

15. The plasma ashing process according to claim 14, wherein the rinsing comprises wetting the substrate with an aqueous HF solution.

16. The plasma ashing process according to claim 1, wherein the reactive species consists essentially of atomic hydrogen.

17. The plasma ashing process according to claim 1, wherein the reactive species are selected from the group consisting of atomic hydrogen, atomic fluorine and mixtures thereof.

18. The plasma ashing process according to claim 1, wherein the substrate further comprises a copper metal layer.

19. A post etch plasma ashing process for selectively removing photoresist, polymers and residues from a semiconductor substrate, wherein the substrate includes a layer comprising a carbon and/or hydrogen containing low k dielectric material having a dielectric constant less than 3.0, the plasma ashing process comprising:
   placing the substrate including photoresist, and/or polymers and residues on the surface of the substrate into a reaction chamber;
   forming reactive species by generating a plasma from a gas composition in the absence of oxygen and nitrogen,
   exposing the substrate to reactive species consisting essentially of atomic hydrogen and atomic fluorine; and
   selectively removing the photoresist, polymer and residues from the surface by forming volatile compounds, rinse removable compounds and mixtures thereof, wherein the surface of the substrate remains substantially unchanged during the plasma ashing process.

20. The post etch plasma ashing process according to claim 19, wherein the gas composition consists of hydrogen gas, helium gas and fluorine bearing gas.

21. The post etch plasma ashing process according to claim 20, wherein the fluorine bearing gas comprises a tetrafluoromethane gas.

22. The post etch plasma ashing process according to claim 19, wherein the gas composition consists of hydrogen fluoride gas.

23. The post etch plasma ashing process according to claim 19, wherein the hydrogen gas is in an amount ranging from about 1 percent to about 99 percent of the total gas composition.

24. The post etch plasma ashing process according to claim 19, wherein the hydrogen gas is in an amount ranging from about 3 percent to about 30 percent of the total gas composition.

25. The post etch plasma ashing process according to claim 19, wherein the hydrogen gas is in an amount ranging from about 1 percent to about 5 percent of the total gas composition.

26. The post etch plasma ashing process according to claim 19, wherein an ashing selectivity between the photoresist and the substrate is greater than 50:1.

27. The post etch plasma ashing process according to claim 19, wherein the dielectric constant of the carbon and/or hydrogen containing insulating layer essentially does not change during the plasma ashing process.

28. The post etch plasma ashing process according to claim 19, wherein the chemical composition of the low k dielectric material essentially does not change during the plasma ashing process.

29. The post etch plasma ashing process according to claim 19, further comprising rinsing the substrate, wherein a critical dimension of a feature on the substrate essentially does not change during rinsing.

30. The post etch plasma ashing process according to claim 29, wherein the rinsing step comprises wetting the substrate with an aqueous HF solution.

31. A method of manufacturing a microelectronic device, the method comprising:
   forming a photoresist mask on a surface of a semiconductor substrate, wherein the substrate includes a carbon or a hydrogen containing low k dielectric layer;
   etching and removing portions of the substrate through openings in the photoresist mask to permanently transfer an image into the substrate and expose a surface of the low k dielectric layer, wherein the etching and removing portions of the substrate forms polymers and residues on surfaces of the substrate; and
   ashing the photoresist mask, the polymers and the residues from the substrate with a plasma generated from a gas mixture consisting of hydrogen, helium and tetrafluoromethane to selectively remove the mask and residues from the substrate.

32. The method according to claim 31, wherein the low k dielectric layer has a dielectric constant less than 3.0.

33. The method according to claim 31 wherein the carbon-containing low k dielectric layer comprises a polymer having a backbone containing carbon.

34. The method according to claim 31 wherein the carbon-containing dielectric layer comprises a carbon doped oxide.

35. The method according to claim 31 wherein the plasma contains from about 1 percent to about 99 volume percent of hydrogen in the gas mixture.

36. The method according to claim 31 wherein the plasma contains from about 10 percent about 30 volume percent of hydrogen in the gas mixture.

37. The method according to claim 31, wherein the plasma contains from about 1 percent about 5 volume percent of hydrogen in the gas mixture.

38. The method according to claim 31 further comprising removing the photoresist mask with the plasma at a temperature less than about 450° C. and a pressure less than about 6 torr.

39. The plasma ashing process according to claim 31, further comprising rinsing the substrate subsequent to ashing the photoresist from the substrate, wherein a critical dimension of the image in the substrate essentially does not change during rinsing.

40. The plasma ashing process according to claim 39, wherein the rinsing step comprises wetting the substrate with an aqueous HF solution.

41. The plasma ashing process according to claim 31, wherein the ashing step consists essentially of exposing the substrate to atomic hydrogen, atomic helium and atomic fluorine species.

42. The plasma ashing process according to claim 31, wherein the ashing step consists essentially of exposing the substrate to atomic hydrogen, and atomic helium species.

43. The plasma ashing process according to claim 31, wherein the etch residues comprise sidewall polymers formed during the etching step.

44. A plasma ashing process for selectively stripping photoresist and/or polymers and residues from a surface of a substrate, the method comprising:
   placing a substrate having a photoresist mask thereon into a reaction chamber;
   generating a plasma from a gas mixture consisting of hydrogen, helium and tetrafluoromethane, wherein the plasma contains both electrically neutral and charged particles;
   substantially removing the charged particles from the plasma;
   exposing the substrate and photoresist mask to the electrically neutral species in the plasma, wherein the substrate exposed to the plasma includes a carbon and/or hydrogen containing low k dielectric material; and
   ashing the photoresist mask to selectively remove the mask from the substrate, wherein the chemical composition of the low k dielectric layer is substantially the same as before the step of exposing the substrate to the plasma.

45. A plasma ashing process for selectively stripping photoresist and/or polymers and residues from a surface of a substrate, the method comprising:
   placing a substrate having a photoresist mask thereon into a reaction chamber;
   generating a plasma from a gas mixture consisting of hydrogen and helium, wherein the plasma contains both electrically neutral and charged particles;
   substantially removing the charged particles from the plasma;
   exposing the substrate and photoresist mask to the electrically neutral species in the plasma, wherein the substrate exposed to the plasma includes a carbon and/or hydrogen containing low k dielectric material; and
   ashing the photoresist mask to selectively remove the mask from the substrate, wherein the chemical composition of the low k dielectric layer is substantially the same as before the step of exposing the substrate to the plasma.

* * * * *

(12) EX PARTE REEXAMINATION CERTIFICATE (6170th)
United States Patent
Waldfried et al.

(10) Number: US 6,630,406 C1
(45) Certificate Issued: Apr. 1, 2008

(54) PLASMA ASHING PROCESS

(75) Inventors: Carlo Waldfried, Falls Church, VA (US); Ivan Berry, Ellicott City, MD (US); Orlando Escorcia, Falls Church, VA (US); Qingyuan Han, Columbia, MD (US); Palani Sakthivel, Gaithersburg, MD (US)

(73) Assignee: Axcelis Technologies, Beverly, MA (US)

Reexamination Request:
No. 90/007,367, Jan. 7, 2005

Reexamination Certificate for:
Patent No.: 6,630,406
Issued: Oct. 7, 2003
Appl. No.: 09/855,177
Filed: May 14, 2001

(51) Int. Cl.
*H01L 21/311* (2006.01)
*H01L 21/02* (2006.01)
*H01L 21/3213* (2006.01)

(52) U.S. Cl. .............. 438/710; 438/711; 438/714; 438/725; 257/E21.256

(58) Field of Classification Search ............ None
See application file for complete search history.

(56) References Cited

U.S. PATENT DOCUMENTS

| 4,689,112 | A | * | 8/1987 | Bersin ................ 438/709 |
| 6,399,552 | B1 | * | 6/2002 | Lee et al. ............ 510/175 |
| 6,413,877 | B1 | * | 7/2002 | Annapragada ........ 438/723 |
| 6,448,185 | B1 | * | 9/2002 | Andideh et al. ...... 438/706 |
| 6,805,139 | B1 | | 10/2004 | Savas et al. |
| 7,001,848 | B1 | * | 2/2006 | Smith et al. ......... 438/725 |
| 2002/0175144 | A1 | * | 11/2002 | Hung et al. .......... 216/67 |

* cited by examiner

*Primary Examiner*—Erik Kielin

(57) ABSTRACT

An oxygen-free and nitrogen-free plasma ashing process for removing photoresist in the presence of a low k material from a semiconductor substrate. The process includes forming reactive species by exposing a plasma gas composition to an energy source to form plasma. The plasma gas composition is free from oxygen-bearing and nitrogen-bearing gases. The plasma selectively removes the photoresist from the underlying substrate containing low k material by exposing the photoresist to the reactive species. The process can be used with carbon and/or hydrogen based low k dielectric materials.

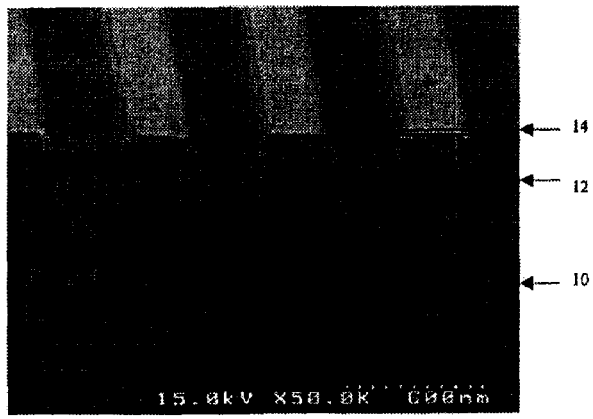

US 6,630,406 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–18 are cancelled.

Claims 19, 31, 38, 44 and 45 are determined to be patentable as amended.

Claims 20–30, 32–37 and 39–43, dependent on an amended claim, are determined to be patentable.

New claims 46–61 are added and determined to be patentable.

19. A post etch plasma ashing process for selectively removing photoresist, polymers and residues from a semiconductor substrate, wherein the substrate includes a layer comprising a carbon and/or hydrogen containing low k dielectric material having a dielectric constant less than 3.0, the plasma ashing process comprising:
    placing the substrate including photoresist, and/or polymers and residues on the surface of the substrate into a reaction chamber;
    *heating the substrate to a temperature within a range from room temperature to 450° C.;*
    forming reactive species *comprised of electrically neutral and charged particles* by generating a plasma from a gas composition in the absence of oxygen and nitrogen[.] *;*
    *removing substantially all of the charged particles from the reactive species prior to exposing the substrate to the reactive species;*
    exposing the substrate to *the electrically neutral* reactive species consisting essentially of atomic hydrogen and atomic fluorine; and
    selectively removing the photoresist, polymer and residues from the surface by forming volatile compounds, rinse removable compounds and mixtures thereof, wherein the surface of the substrate remains substantially unchanged during the plasma ashing process.

31. A method of manufacturing a microelectronic device, the method comprising:
    forming a photoresist mask on a surface of a semiconductor substrate, wherein the substrate includes a carbon or a hydrogen containing low k dielectric layer;
    etching and removing portions of the substrate through openings in the photoresist mask to permanently transfer an image into the substrate and expose a surface of the low k dielectric layer, wherein the etching and removing portions of the substrate forms polymers and residues on surfaces of the substrate; and
    ashing the photoresist mask, the polymers and the residues from the substrate with a plasma *comprising electrically neutral and charged particles* generated from a gas mixture consisting of hydrogen, helium and tetrafluoromethane to selectively remove the mask and residues from the substrate, *wherein the substrate is heated to a temperature within a range from room temperature to 450° C. during ashing and substantially all of the charged particles are removed from the plasma prior to ashing.*

38. The method according to claim 31 further comprising removing the photoresist mask with the plasma at a temperature less than about 450° C. and a pressure less than about 6 torr.

44. A plasma ashing process for selectively stripping photoresist and/or polymers and residues from a surface of a substrate, the method comprising:
    placing a substrate having a photoresist mask thereon into a reaction chamber;
    generating a plasma from a gas mixture consisting of hydrogen, helium and tetrafluoromethane, wherein the plasma contains both electrically neutral and charged particles;
    [substantially] removing *substantially all of* the charged particles from the plasma *prior to exposure of the substrate to the plasma*;
    exposing the substrate and photoresist mask to the electrically neutral species in the plasma, wherein the substrate exposed to the plasma includes a carbon and/or hydrogen containing low k dielectric material; and
    ashing the photoresist mask to selectively remove the mask from the substrate, wherein the chemical composition of the low k dielectric layer is substantially the same as before the step of exposing the substrate to the plasma.

45. A plasma ashing process for selectively stripping photoresist and/or polymers and residues from a surface of a substrate, the method comprising:
    placing a substrate having a photoresist mask thereon into a reaction chamber;
    generating a plasma from a gas mixture consisting of hydrogen and helium, wherein the plasma contains both electrically neutral and charged particles;
    [substantially] removing *substantially all of* the charged particles from the plasma *prior to exposure of the substrate to the plasma*;
    exposing the substrate and photoresist mask to the electrically neutral species in the plasma, wherein the substrate exposed to the plasma includes a carbon and/or hydrogen containing low k dielectric material; and
    ashing the photoresist mask to selectively remove the mask from the substrate, wherein the chemical composition of the low k dielectric layer is substantially the same as before the step of exposing the substrate to the plasma.

*46. A plasma ashing process for selectively removing photoresist from a semiconductor substrate including a low k material, the process comprising:*
    *heating the substrate to a temperature within a range from room temperature to 450° C.;*
    *forming reactive species comprised of electrically neutral and charged particles by exposing a plasma gas composition comprising a hydrogen bearing gas and helium to an energy source to form a plasma, wherein the plasma is free from reactive nitrogen species and reactive oxygen species;* removing substantially all of the charged particles from the plasma prior to exposing the substrate to the plasma; and exposing the substrate having the photoresist thereon to the electrically neutral reactive species to selectively remove the photoresist and leave the low k material substantially the same as before exposing the substrate to the reactive species.

47. The plasma ashing process according to claim 46, wherein the process occurs subsequently to an etching process.

48. The plasma ashing process according to claim 46, wherein the process occurs during a rework process.

49. The plasma ashing process according to claim 46, wherein the hydrogen-bearing gas is selected from the group consisting of hydrocarbons, hydrofluorocarbons, and hydrogen gas.

50. The plasma ashing process according to claim 46, wherein the gas composition further comprises a fluorine-bearing gas.

51. The plasma ashing process according to claim 50, wherein the fluorine bearing gas is selected from the group consisting of a compound having a formula $C_xH_yF_z$, wherein x ranged from 1 to 4, y ranges from 0 to 9 and z ranges from 1 to 10, HF, $F_2$ and $SF_6$.

52. The plasma ashing process according to claim 46, wherein the substrate comprises a carbon and/or hydrogen containing insulating layer having a dielectric constant less than 3.0.

53. The plasma ashing process according to claim 46, wherein the hydrogen bearing gas is hydrogen gas.

54. The plasma ashing process according to claim 46, wherein the hydrogen bearing gas is in an amount ranging from about 3 percent to about 30 percent by volume of the total plasma gas composition.

55. The plasma ashing process according to claim 46, wherein the dielectric constant of the carbon and/or hydrogen containing insulating layer essentially does not change during the plasma ashing process.

56. The plasma ashing process according to claim 46, wherein the chemical composition of the substrate essentially does not change during the plasma ashing process.

57. The plasma ashing process according to claim 46, further comprising rinsing the substrate, wherein a critical dimension of a feature in the substrate essentially does not change during rinsing.

58. The plasma ashing process according to claim 57, wherein the rinsing comprises wetting the substrate with an aqueous HF solution.

59. The plasma ashing process according to claim 46, wherein the reactive species consists essentially of atomic hydrogen.

60. The plasma ashing process according to claim 46, wherein the reactive species are selected from the group consisting of atomic hydrogen, atomic fluorine and mixtures thereof.

61. The plasma ashing process according to claim 46, wherein the substrate further comprises a copper metal layer.

* * * * *